(12) United States Patent
Fick et al.

(10) Patent No.: US 11,726,925 B2
(45) Date of Patent: Aug. 15, 2023

(54) SYSTEM AND METHODS FOR MIXED-SIGNAL COMPUTING

(71) Applicant: Mythic, Inc., Austin, TX (US)

(72) Inventors: Laura Fick, Austin, TX (US); Manar El-Chammas, Austin, TX (US); Skylar Skrzyniarz, Austin, TX (US); David Fick, Austin, TX (US)

(73) Assignee: Mythic, Inc., Austin, TX (US)

( * ) Notice: Subject to any disclaimer, the term of this patent is extended or adjusted under 35 U.S.C. 154(b) by 0 days.

(21) Appl. No.: 17/900,363

(22) Filed: Aug. 31, 2022

(65) Prior Publication Data

US 2022/0414025 A1 Dec. 29, 2022

Related U.S. Application Data

(63) Continuation of application No. 16/280,317, filed on Feb. 20, 2019, now Pat. No. 11,467,984, which is a
(Continued)

(51) Int. Cl.
*G06F 13/10* (2006.01)
*G06F 1/14* (2006.01)
(Continued)

(52) U.S. Cl.
CPC .............. *G06F 13/102* (2013.01); *G06F 1/14* (2013.01); *G06F 9/3001* (2013.01); *G06N 3/04* (2013.01); *H03M 1/48* (2013.01); *H03M 1/662* (2013.01)

(58) Field of Classification Search
None
See application file for complete search history.

(56) References Cited

U.S. PATENT DOCUMENTS 5,017,919 A 5/1991 Hull et al.
5,167,008 A 11/1992 Engeler
(Continued)

FOREIGN PATENT DOCUMENTS

EP 3682377 A1 7/2020
JP 2020534626 A 11/2020

OTHER PUBLICATIONS

F.J. Pelayo et al., "Cmos Implementation of Synapse Matrices with Programmable Analog Weights", Artificial Neural Networks, Sep. 17, 1991, pp. 307-314.
(Continued)

*Primary Examiner* — Scott C Sun
(74) *Attorney, Agent, or Firm* — Padowithz Alce; Alce PLLC

(57) ABSTRACT

Systems and methods of implementing a mixed-signal integrated circuit includes sourcing, by a reference signal source, a plurality of analog reference signals along a shared signal communication path to a plurality of local accumulators; producing an electrical charge, at each of the plurality of local accumulators, based on each of the plurality of analog reference signals; adding or subtracting, by each of the plurality of local accumulators, the electrical charge to an energy storage device of each of the plurality of local accumulators over a predetermined period; summing along the shared communication path the electrical charge from the energy storage device of each of the plurality of local accumulators at an end of the predetermined period; and generating an output based on a sum of the electrical charge from each of the plurality of local accumulators.

20 Claims, 7 Drawing Sheets

Related U.S. Application Data continuation of application No. 16/127,488, filed on Sep. 11, 2018, now Pat. No. 10,255,205.

(60) Provisional application No. 62/559,354, filed on Sep. 15, 2017.

(51) Int. Cl.
*G06N 3/04* (2023.01)
*H03M 1/48* (2006.01)
*G06F 9/30* (2018.01)
*H03M 1/66* (2006.01)

(56) References Cited

U.S. PATENT DOCUMENTS

| | | | |
|---|---|---|---|
| 5,444,446 | A | 8/1995 | Gopinathan et al. |
| 5,559,722 | A | 9/1996 | Nickerson |
| 6,690,310 | B1 | 2/2004 | Upton |
| 7,157,941 | B2 | 1/2007 | Koo |
| 8,013,761 | B2 | 9/2011 | Mayer |
| 8,339,179 | B2 | 12/2012 | Sun et al. |
| 9,176,512 | B2 | 11/2015 | Singnurkar |
| 9,991,001 | B2 | 6/2018 | Maayan et al. |
| 10,255,551 | B2 | 4/2019 | Fick et al. |
| 2002/0163456 | A1 | 11/2002 | Dedic |
| 2004/0160798 | A1* | 8/2004 | Rinerson ............ G11C 13/0069 365/100 |
| 2011/0119215 | A1 | 5/2011 | Elmegreen et al. |
| 2013/0144821 | A1 | 6/2013 | Heliot et al. |
| 2014/0376676 | A1 | 12/2014 | Schafferer |
| 2015/0278681 | A1 | 10/2015 | Saxena |
| 2016/0182260 | A1 | 6/2016 | Dong |
| 2016/0373120 | A1 | 12/2016 | Caffee et al. |

OTHER PUBLICATIONS

European Application No. 18856455, Extended European Search Report dated May 6, 2021, 7 pages.
International Search Report and Written Opinion of the ISA, dated May 10, 2019, for application No. PCT/US19/019537.
A. F. Murray, "Pulse Arithmetic in VLSI Neural Networks", IEEE Micro, vol. 9, No. 6, Dec. 1, 1989, pp. 64-74.
Chinese Application No. 201880060086.3, First Office Action dated Mar. 23, 2023, 7 pages.
Korean Application No. 10-2020-7009371, Office Action dated May 1, 2023, 10 pages.

* cited by examiner

200 

```
┌─────────────────────────────────────────┐
│  Generating Global Reference Signal S210│
└─────────────────────────────────────────┘

┌─────────────────────────────────────────┐
│       Transmitting GR Signal S215       │
└─────────────────────────────────────────┘

┌─────────────────────────────────────────┐
│   Duplicating GR Signal at each LDAC S220│
└─────────────────────────────────────────┘

┌─────────────────────────────────────────┐
│       Generating Output Signal S230     │
└─────────────────────────────────────────┘
```

FIGURE 2

SYSTEM AND METHODS FOR MIXED-SIGNAL COMPUTING

CROSS-REFERENCE TO RELATED APPLICATIONS

This application is a continuation of U.S. patent application Ser. No. 16/280,317, filed 20 Feb. 2019, which is a continuation of U.S. Pat. No. 10,255,205, issued 9 Apr. 2019, which claims the benefit of U.S. Provisional Application No. 62/559,354, filed 15 Sep. 2017, which are incorporated in their entireties by this reference.

TECHNICAL FIELD

The inventions herein relate generally to the integrated circuitry architecture field, and more specifically to new and useful mixed-signal integrated circuits and methods of computing mixed-signals in the integrated circuitry architecture field.

BACKGROUND

Today, the various implementations of artificial intelligence are driving innovation in many fields of technology. Artificial intelligence (AI) systems and artificial intelligence models (including algorithms) are defined by many system architectures and models that enable machine learning (deep learning), reasoning, inferential capacities, and large data processing capabilities of a machine (e.g., a computer and/or a computing server). These AI systems and models are often trained intensively to perform one or more specific tasks, such as natural language processing, image recognition, planning, decision-making, and the like. For example, a subset of these AI systems and models include artificial neural network models. The training of an artificial neural network model may, in many cases, require thousands of hours across the training cycle and many terabytes of training data to fine tune associated neural network algorithm(s) of the model before use.

However, once trained, a neural network model or algorithm may be deployed quickly to make inferences to accomplish specific tasks (e.g., recognizing speech from speech input data, etc.) based on relatively smaller datasets when compared to the larger training datasets used during the training cycle. The inferences made by the neural network model or algorithm based on the smaller datasets may be a prediction about what the neural network calculates to be a correct answer or indication about a circumstance.

Still, while neural network models or algorithms may not require a same amount of compute resources, as required in a training phase, deploying a neural network model or algorithm in the field continues to require significant circuitry area, energy, and compute power to classify data and infer or predict a result. This is because many of the traditional computers and systems that implement neural network models or algorithms tend to be larger to accommodate a great amount of circuitry needed for computing power and increased data processing speeds when implementing the neural network model and due to the large size of the circuitry, more energy is required to enable the compute power of the many circuits.

These traditional computers and systems for implementing artificial intelligence models and, namely, neural network models may be suitable for remote computing, such as in distributed computing systems (e.g., the cloud), or when using many onsite computing servers and the like. However, latency problems are manifest when these remote artificial intelligence processing systems are used in computing inferences and the like for remote, edge computing devices or in field devices. That is, when these traditional remote systems seek to implement a neural network model for generating inferences to be used in remote field devices, there are unavoidable delays in receiving input data from the remote field devices because the input data must often be transmitted over a network with varying bandwidth and subsequently, inferences generated by the remote computing system must be transmitted back to the remote field devices via a same or similar network.

Implementing AI processing systems at the field level (e.g., locally at the remote field device) may be a proposed solution to resolve some of the latency issues. However, attempts to implement some of these traditional AI computers and systems at an edge device (e.g. remote field device) may result in a bulky system with many circuits, as mentioned above, that consumes significant amounts of energy due to the required complex architecture of the computing system used in processing data and generating inferences. Thus, such a proposal without more may not be feasible and/or sustainable with current technology.

Accordingly, there is a need for a deployable system for implementing artificial intelligence models locally in the field (e.g., local AI), and preferably to be used in edge devices, that do not result in large, bulky (edge) devices, that reduces latency, and that have necessary compute power to make predictions or inferences, in real-time or substantially real-time, while also being energy efficient.

The below-described embodiments of the present application provide such advanced and improved integrated circuits and implementation techniques capable of addressing the deficiencies of traditional systems and integrated circuit architectures for implementing AI and machine learning.

SUMMARY OF THE INVENTION

In one embodiment, a mixed-signal integrated circuit includes a reference signal source that generates a plurality of analog reference signals based on digital input, wherein an output terminal of the reference signal source is electrically connected to a shared signal path, and wherein the reference signal source sources the plurality of analog reference signals to the shared signal path; a plurality of local signal accumulators arranged along the shared signal path and each of the plurality of local signal accumulators having an input terminal electrically connected to the shared signal path, wherein each of the plurality of local signal accumulators: collects, via the shared signal path, the plurality of analog reference signals from the reference signal source; and stores a sum of the plurality of electrical charges over a predetermined number of clock cycles.

In one embodiment, each of the plurality of local signal accumulators further: receives one or more biasing signal input or control signal input for incrementing or decrementing each of the plurality of electrical charges to an energy storage device.

In one embodiment, an output terminal of each of the plurality of local signal accumulators is electrically connected to one input terminal of a plurality of input terminals of a neural network implementation, and each of the plurality of local signal accumulators outputs the sum of the plurality of electrical charges to one input terminal of the plurality of input terminals of the neural network implementation.

In one embodiment, each of a plurality of output terminals of the neural network implementation is electrically connected to an input terminal of each of a plurality of local analog-to-digital converters, and each of the plurality of output terminals of the neural network implementation sources an analog output signal to an internal node of each of the plurality of local analog-to-digital converters.

In one embodiment, an output terminal of each of the plurality of local signal accumulators is electrically connected to an input terminal of the internal node of each of the plurality of local analog-to-digital converters, and each of the plurality of local analog-to-digital converters outputs a binary biasing signal to a respective one of the plurality of local signal accumulators for incrementing or decrementing each of the plurality of electrical charges to an energy storage device.

In one embodiment, each of the plurality of local accumulators comprises a digital-to-analog converter comprising: a pair of current mirrors that duplicate a plurality of current charges generated based on the plurality of analog reference signals provided via the shared signal path; and an energy storage device that stores the sum of the plurality of electrical charges.

In one embodiment, each of the plurality of local accumulators comprises a digital-to-analog converters comprising: an energy storage device; and an amplifier that integrates the plurality of electrical charges over consecutive clock cycles on the energy storage device.

In one embodiment, the reference signal source comprises a binary-weighted digital-to-analog converter that generates binary-weighted analog reference signals, the plurality of analog reference signals comprise a plurality of binary-weighted analog reference signals that vary in value over the predetermined number of clock cycles, and each of the plurality of local accumulators sums the plurality of electrical charges on an energy storage device based on the plurality of binary-weighted analog reference signals for each clock cycle of the predetermined number of clock cycles.

In one embodiment, the reference signal source comprises an N-bit binary-weighted digital-to-analog converter, where N represents a number of bits, wherein the predetermined number of clock cycles equals N clock cycles, and each of the plurality of local accumulators sum the plurality of electrical charges over N clock cycles.

In one embodiment, each of the plurality of local accumulators comprises a programmable current source that generates an electrical current charge based on each of the plurality of analog reference signals.

In one embodiment, the reference signal source comprises a single global digital-to-analog converter that includes circuitry that generates the plurality of analog reference signals; and the plurality local accumulators comprise a plurality of local digital-to-analog converters having circuitry distinct from the circuitry of the single global digital-to-analog converter.

In one embodiment, the reference signal source comprises a thermometer encoding global digital-to-analog converter that generates thermometer encoded analog reference signals, wherein the plurality of analog reference signals comprise a plurality of thermometer encoded analog reference signals having a constant value; and each of the plurality of local accumulators stores the sum of the plurality of electrical charges on an energy storage device based on the plurality of thermometer encoded analog reference signals for each clock cycle of the predetermined number of clock cycles.

In one embodiment, the reference signal source comprises a segmented global signal reference source comprising two or more signal reference sources that are combined and generate high resolution analog reference signals, wherein the plurality of analog reference signals comprise a plurality of high resolution analog reference signals, and each of the plurality of local accumulators stores the sum of the plurality of electrical on an energy storage device based on the plurality of high resolution analog reference signals for each clock cycle of the predetermined number of clock cycles.

In one embodiment, the shared signal path comprises a single electrically conductive signal wire having multiple connections that connect each of the plurality of local accumulators at distinct positions along the shared signal path.

In one embodiment, the plurality of analog reference signals generated by the reference source comprise a plurality of voltage reference signals, and each of the plurality of local accumulators converts the plurality of voltage reference signals to a plurality of current charges.

In one embodiment, the reference signal source comprises a current source global digital-to-analog converter that generates a current reference signal based on a selection of one current source of a plurality of current sources, wherein the plurality of analog reference signals comprise a plurality of current reference signals; and each of the plurality of local accumulators stores the sum of the plurality of electrical charges on an energy storage device based on the plurality of current reference signals for each clock cycle of the predetermined number of clock cycles.

In one embodiment, a method of implementing a mixed-signal computing circuit includes sourcing, by a global reference signal source, a plurality of analog reference signals along a shared signal communication path to a plurality of local accumulators; producing a plurality of electrical charges, at each of the plurality of local accumulators, based on the plurality of analog reference signals; adding or subtracting, by each of the plurality of local accumulators, each of the plurality of electrical charges to an energy storage device associated with each of the plurality of local accumulators over a predetermined period; and generating, by each of the plurality of local accumulators, an output based on a sum of the plurality of electrical charges.

In one embodiment, the shared signal path comprises a single electrically conductive signal wire having multiple connections that connect an input terminal of each of the plurality of local accumulators at distinct positions along the shared signal path, and each of the plurality of local accumulators being serially arranged along the shared signal path downstream of the global reference source.

In one embodiment, an output terminal of each of the plurality of local signal accumulators is electrically connected to one input terminal of a plurality of input terminals of a neural network implementation, and each of the plurality of local signal accumulators outputs the sum of the plurality of electrical charges to the one input terminal of the plurality of input terminals of the neural network implementation.

In one embodiment, each of a plurality of output terminals of the neural network implementation is electrically connected to an input terminal of each of a plurality of local analog-to-digital converters, each of the plurality of output terminals of the neural network implementation sources an analog output signal to a sub-circuit of each of the plurality of local analog-to-digital converters, and an output terminal of each of the plurality of local signal accumulators is in electrically communication with an input terminal of the sub-circuit of each of the plurality of local analog-to-digital converters.

BRIEF DESCRIPTION OF THE FIGURES

FIG. 2 illustrates a method 200 in accordance with one or more embodiments of the present application;

DESCRIPTION OF THE PREFERRED EMBODIMENTS

Figure 1:
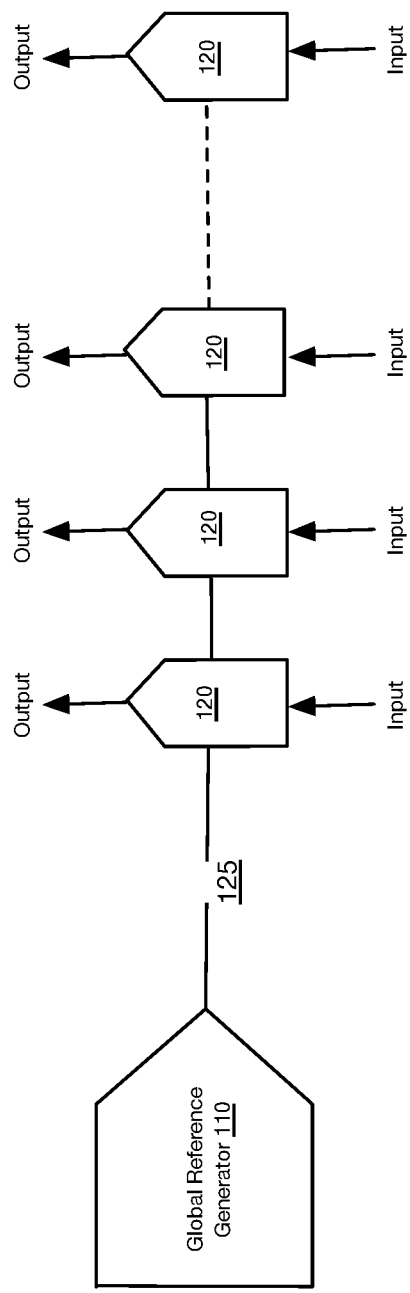
FIG. 1 illustrates a schematic of an integrated circuit 100 in accordance with one or more embodiments of the present application.

The following description of preferred embodiments of the present application are not intended to limit the inventions to these preferred embodiments, but rather to enable any person skilled in the art of to make and use these inventions.

Overview

In traditional integrated circuits used in implementing computationally-intensive programs or applications (e.g., deep neural network algorithms) and the like, the typical integrated circuit (IC) architecture includes relatively large circuits requiring large area and power to operate and perform computations. This is because processing digital signals (e.g., binary signals) often requires large and power hungry implementations of circuits. Thus, for many technological implementations of computationally-intensive programs, such as artificial intelligence models, the resulting computer ICs having these large circuits for processing digital signals are also large and therefore, less feasible to include in space-constrained edge devices and the like.

Further, a great majority of the computational effort of an integrated circuit in implementing computationally-intensive applications, such as neural network models, involve performing thousands to millions of matrix multiplications. Further, in digital signal processing for neural network models, multiply-accumulate operations may also be performed in which a product of two numbers is computed and the product then added to an accumulator. Thus, when neural network models are implemented using only or primarily digital circuitry, the resulting digital circuitry consumes large amounts of energy performing the calculations and storing weight coefficients for neurons and resultant products of the many multiply-accumulate operations.

As a technical solution to reduce power required for computing and an overall size of an integrated circuit that is capable of computationally-intensive processes includes providing mixed-signal computing architectures that may be implemented utilizing extremely area efficient digital-to-analog converters (DACs) (rather than standard DACs which are fundamentally large, or area-intensive) along-side the various other circuitry of an integrated circuit to achieve area and energy efficiencies. However, integrated circuits that may be implemented using traditional DACs for computationally-intensive implementations, may most likely require a very large number of DACs (e.g., thousands of DACs) to achieve matching and to achieve required speed and noise performances. Therefore, while traditional implementations of DAC architectures may be useful to reduce energy required by and an overall size of an integrated circuit, these traditional implementations of DAC architectures may not be feasible due to the large number of DACs that may be necessary to process computationally-intensive AI programs and applications.

The embodiments of the present application, however, solve at least the above-noted technical problems by implementing, in various forms, a global (reference signal source) DAC that is in operable communication and control of a plurality of local (output) DACs. The embodiments described herein function to solve a fundamental technical problem with mixed-signal computing architectures by enabling a creation of many precise DACs without consuming a very large area on a chip. By contrast, modern DACs implementing computationally-intensive programs and the like may typically become large due to matching constraints on their various components, which dictate the lower bound on device size. This technical problem becomes further apparent and problematic once the DAC resolution surpasses 6-8 bits. Consequently, these traditional DACs may not be energy or size efficient once noise and speed are considered in the DAC's architecture.

In embodiments of the present application, the global (reference) DAC functions as a signal source (in some embodiments, the only reference signal source) to each of the local (mirror) DACs. In a preferred embodiment, the local DACs function to serially accumulate analog reference signals generated by the global DAC over a number of clock cycles. In such embodiment, the accumulation by each of the local DACs is onto a capacitor or other energy storage device for the providing a new or total output (e.g., a charge representing the accumulation of the reference signals).

Accordingly, implementing the global DAC and plurality of local DACs in the manner described above enables a reduction of a number of high-precision reference devices required for driving the local DACs, as each local DAC would typically require a respective dedicated reference devices that provide a reference signal. In traditional DACs, a reference signal generation as well as output circuitry may be usually integrated into a single large DAC. Accordingly, in several embodiments of the present application, the global DAC functions to provide precise source signaling to each of a plurality of local DACs therefore ameliorating the matching requirement for implementing accurate DACs and more specifically, a need for a plurality of reference signal source DACs to drive a plurality local output DACs (e.g., eliminating 1-to-1 match). Accordingly, a reduction in DAC architecture area may be achieved and, computer and power efficiencies that allow edge computing devices and the like to perform complex and computer-intensive operations including AI computing locally at a source of the input data.

1. A System for Mixed-Signal Computing

Figure 1A:
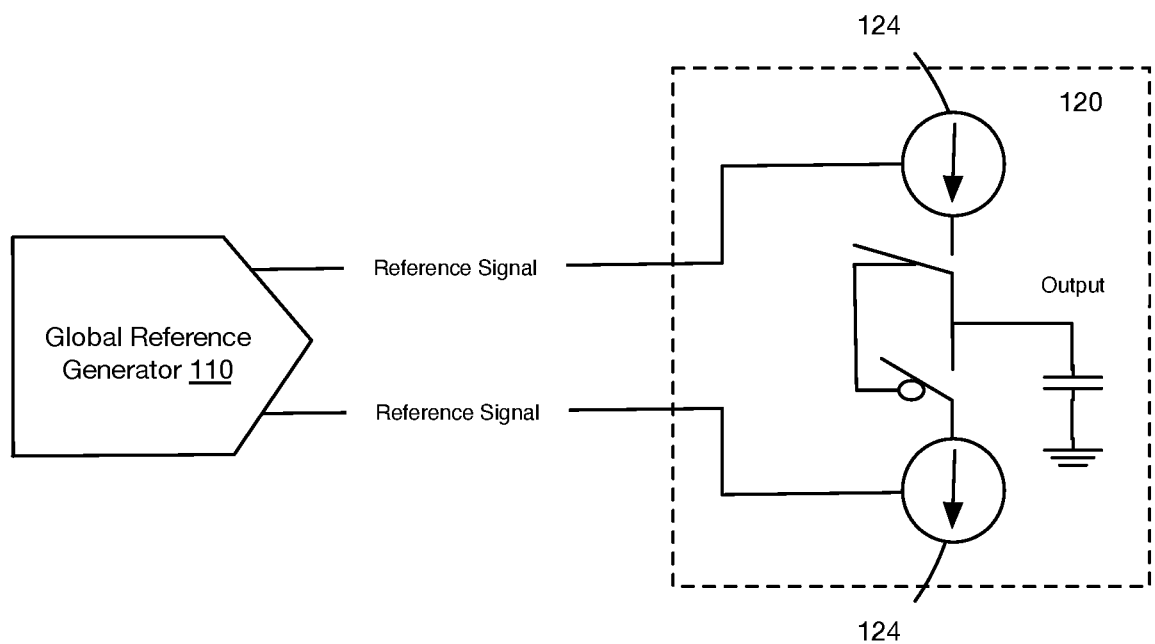
FIGS. 1A-1B illustrate implementations of one or more portions of the system 100 in accordance with one or more embodiments of the present application.

As shown in FIG. 1, a system 100 for implementing mixed-signal computing for computationally-intensive programs and/or applications includes a global reference generator 110, a plurality of local accumulators 120, and a shared signal path 125. As shown in FIG. 1A, in some embodiments, the local accumulators 120 may each include an energy storage device 122, and current mirrors 124.

Figure 1B:
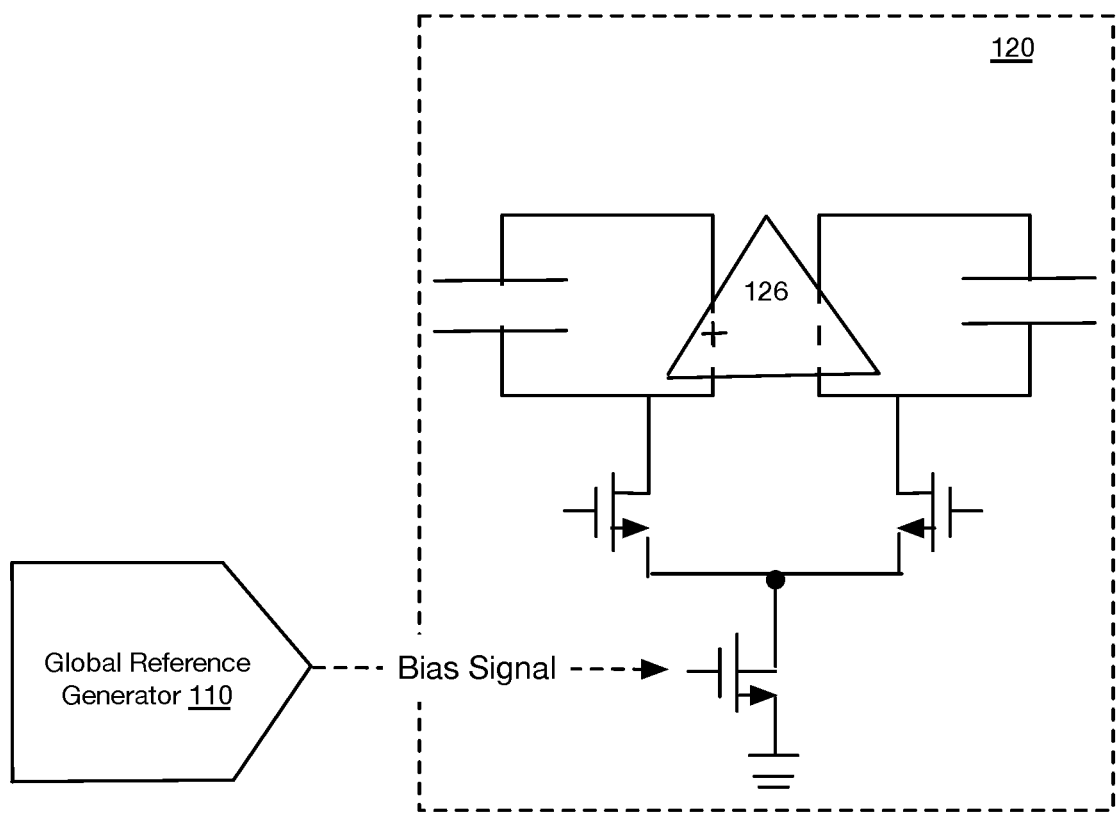

Additionally, or alternatively, as shown in FIG. 1B, each of the local accumulators 120 may include an energy storage device and an amplifier 126, in some embodiments. The system of 100 may preferably be implemented in a more comprehensive system, as described in U.S. Provisional Application No. 62/694,355, which is incorporated herein by this reference in its entirety.

The system 100 preferably functions to bifurcate typical functionality of a digital-to-analog converter into at least two component devices. The first component, in several embodiments, includes the global reference generator 110 that functions to define or generate one or more (analog) reference signals, such as a current, based on a digital input into the global reference generator 110. In some embodiments, the global reference generator 110 may comprise a binary-weighted global reference generator that may be implemented as described in U.S. Provisional Application No. 62/644,908, which is incorporated herein by reference in its entirety. The second component, in several embodiments, includes a set of local accumulating devices that function to receive, via a shared signal path 125, the reference signals from the global reference generator 110 and further function, in some embodiments, to perform some an integration of the reference signals, such as an arithmetic function (e.g., addition, subtraction, etc.) of the values of the reference signals over a set period of time (e.g., over a predetermined number of clock cycles). As with several of the embodiments of the present application, the arithmetic function (e.g., summation) and/or incrementing and decrementing function may be driven by a biasing signal or control input signal received at a local accumulator 120. The biasing signal or control signal input may be generated by any suitable biasing input source or control signal input source including a dedicated bias generator or bias input source, a control processor, a comparator, and/or by a global reference generator 110.

Additionally, or alternatively, in some embodiments, the system 100 may function to generate and provide differential signaling input to each of the plurality of local accumulators 120 for driving output values therein. In such embodiments, the system 100 may function to electrically transmit analog reference signals and/or control input signals to each of the plurality of local accumulators via two complementary signals, as a differential pair of signals.

The system 100 functions to achieve scale and area efficiency (e.g., to make a smaller integrated circuit) with, at least, the above-described configuration by allowing the first component to be large and capable of generating accurate reference signals for the second component comprising the set of small, local accumulating devices. That is, the area and power of the first component (which would be matching and noise limited) is now amortized. Therefore, the system 100 enables an integrated circuit architecture that is capable of performing computationally-intensive operations while having extremely high area and power efficiencies.

Figure 3:
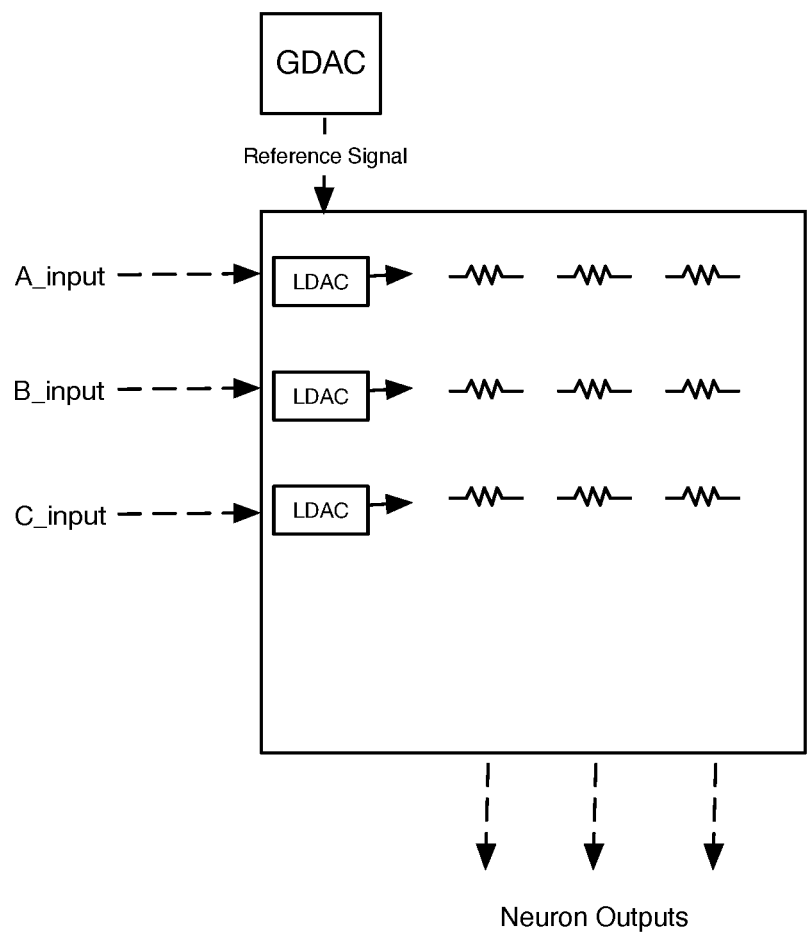
FIG. 3 illustrates an implementation of a system for mixed-signal computing in accordance with one or more embodiments of the present application.

The global reference generator 110 functions to generate reference signals for each of a plurality of local accumulators 120. The global reference generator 110 may sometimes be referred to herein as a global signal source. Preferably the global reference generator 110 comprises a global digital-to-analog converter (DAC), as shown in FIG. 3. In such case, the global DAC may function to receive, as inputs, digital signals (e.g., binary number or input) from an external source, an upstream layer, an upstream device, and/or the like and function to output analog reference signals (e.g., a voltage or current signal) to a plurality of local DACs. In one or more embodiments in which the global reference generator 110 comprises a digital-to-analog converter, the system 100 may function to implement any suitable type of kind of digital-to-analog converter including, but not limited to, a resistor ladder DAC, an R-2R ladder DAC, a current source DAC, a binary-weighted DAC, thermometer-encoded DAC, segmented DAC, a multiplying DAC, a hybrid DAC, and/or the like.

In one or more embodiments, the global source generator 110 comprises a simplified digital-to-analog converter and thus, may not be a full digital-to-analog converter that may typically output 256 bits or levels of analog output. Rather, in one or more preferred embodiments, a configuration of the global source generator 110, when implemented as a DAC, may be limited such that the DAC may only output eight levels (i.e., an 8-bit DAC with less current and/or resistance sources). The simplified structure and/or configuration of such a global reference generator 110, when implemented as a DAC with limited levels of output, enables an implementation of an integrated circuit with a smaller footprint and correspondingly, lower power usage because of the smaller circuit size. It shall be noted, however, that while in one or more embodiments it is preferably to use a limited (circuitry) DAC as a global reference generator, it may be possible to use any suitable and/or type of DAC of any size and having any number of output levels.

Accordingly, the global DAC may function to source analog reference signals to the local accumulators (e.g., local DACs) based on digital input received at the global DAC. Additionally, or alternatively, the reference signal generated and transmitted by the global reference generator 110 to each of the local accumulators may be an analog reference signal, such as a current or voltage, that may be used to control or drive functionality of the local accumulators 120. Accordingly, the global reference signals provided by the global reference generator 110 are preferably transmitted to the local accumulators 120 via a shared signal path 125 (e.g., a shared or common wire) that operably connects the local accumulators 120 to each other as well as to a same global reference generator 110.

The shared signal path 125 preferably extends from an output terminal of the global reference generator 110 downstream to each of a plurality of local accumulators that are connected at respective input terminals thereof. final output circuitry (e.g., an analog-to-digital converter or the like). Additionally, or alternatively, each of a plurality of local accumulators 120 may be serially arranged or positioned along the shared signal path 125. The shared signal path 125 is preferably connected to an output terminal of the global reference generator 110 and each of the input terminals of each of the plurality of local accumulators 120.

Figure 3A:
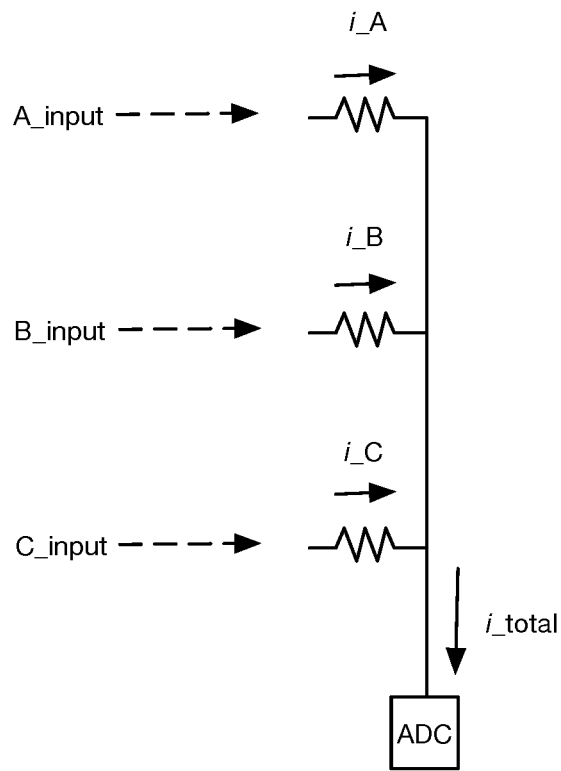
FIG. 3A illustrates a specific implementation of the system for mixed-signal computing of FIG. 3 in accordance with one or more embodiments of the present application.

Referring to FIG. 3, FIGURE illustrates one implementation of the global DAC-to-local DACs architecture in a neural network implementation in which a plurality of local DACs (LDACs) function to receive one or more analog reference signals from a single global DAC (GDAC) (e.g., global reference generator no) and resultantly, each of the LDACs generates an output to the neural network implementation. In this implementation, the output generated by each of the LDACs may be received as input into respective input terminals of the neural network implementation. The output terminals, in such implementation, of each respective LDAC may be electrically connected (directly (e.g., without any intervening nodes) or indirectly) to respective input terminals of the neural network implementation. Additionally, or alternatively, a plurality of biasing inputs (e.g., A_input, B_input, C_input, etc.) may be provided to each of the plurality of LDACs that function to steer or direct an incrementing or decrementing function of each LDAC. For instance, in one embodiment, Accordingly, a biasing input source (e.g., a dedicated biasing input source or a global reference source) local inputs (e.g., A_input, B_input, etc.) to the input terminals of the neural network implementation that may be received at each local DAC may be applied against a tunable resistor (programmable current source) that generates an amount of current charge. With each column of tunable resistors acting as a neuron column (of a neural network) in combination, the current output generated at each tunable resistor in a neuron column may be aggregated (or summed together), as illustrated in FIG. 3A, to form a single, aggregate current output (e.g., a neuron output). Additionally, or alternatively, the aggregate current output may be converted to a digital output using an analog-to-digital converter or any other suitable output circuitry.

Figure 4:
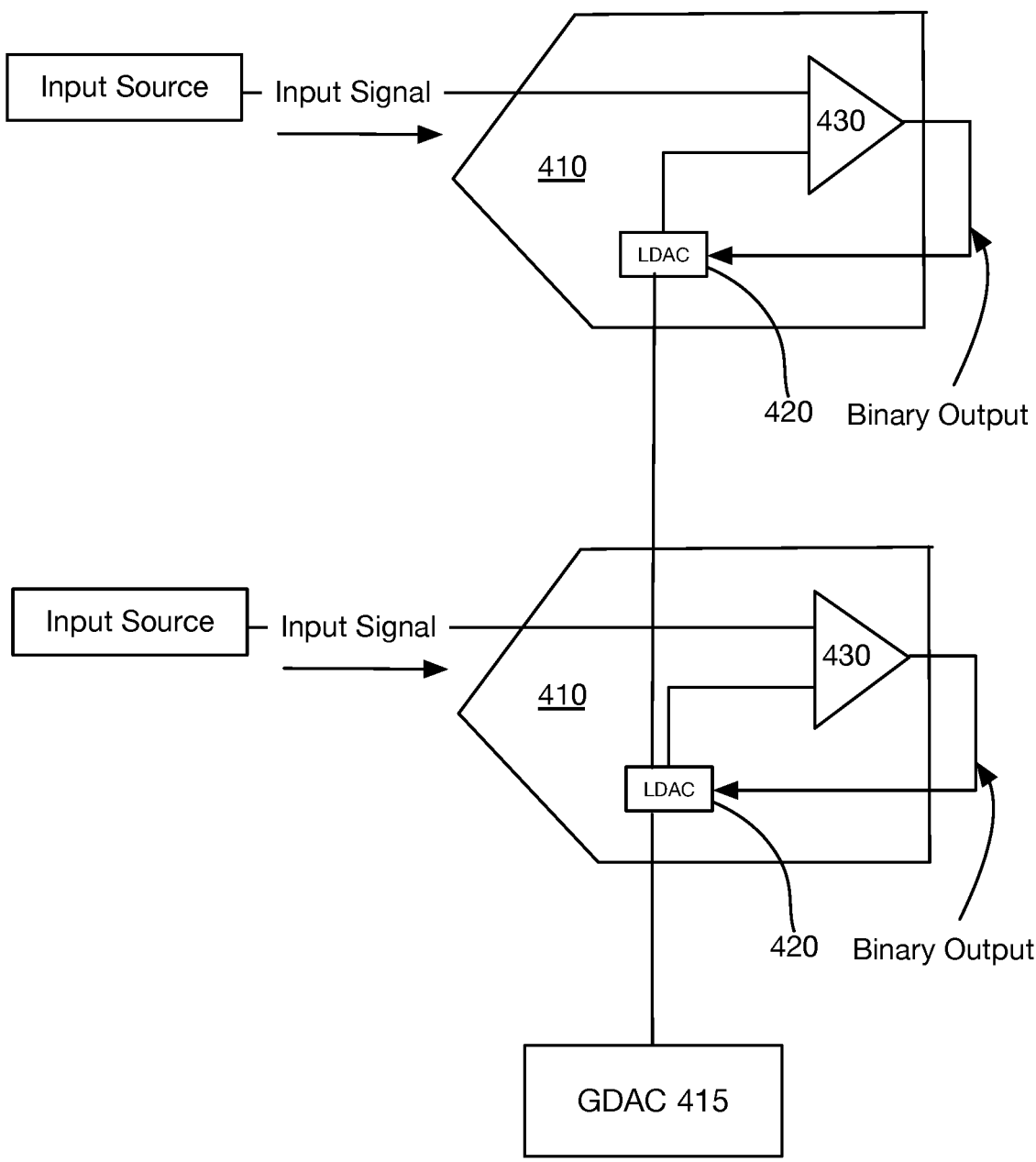
FIG. 4 illustrates a schematic of a subsystem of an integrated circuit in accordance with one or more embodiments of the present application.

Referring to FIG. 4, FIG. 4 illustrates another implementation (related to the implementations of FIGS. 3-3A) in which output from a neural network implementation (or any computationally-intensive implementation, any parallel data processing network, and/or any suitable output source) passes as input into an analog-to-digital converter. In one embodiment of this implementation, the neural network implementation may include a plurality of neural network columns that each produce a respective neuron output (i.e., neuron column output). In this embodiment, a plurality of local analog-to-digital converters (ADCs) may be arranged to receive the respective neuron outputs from each respective neuron column of the neural network implementation.

Additionally, or alternatively, each of the plurality of local ADCs 410 may be configured or designed with a local DAC 420 and an internal node 430. Accordingly, in such implementation, the global DAC-to-local DACs architecture may be implemented with the plurality of local ADCs 410 such that each of the plurality of local ADCs 410 includes a local DAC and each of the input terminals of the local DACs may be arranged along a shared signal path for receiving one or more reference signals from the global DAC 415. In some embodiments, the global DAC 415 may be the same as the global reference generator 110, such that the reference signals for the plurality local accumulators 120 and the plurality of local DACs 420 originate from a same signal source. It shall be noted that the internal node 430 of each of the local ADCs may include, but shall not be limited to, a comparator circuit, an amplifier, and/or any suitable sub-circuit. In one or more preferred embodiments, the internal node 430 comprises a comparator circuit and the like.

In operation, each of the plurality of local ADCs 410 may function to receive an analog neuron output from a respective neuron column of the neural network implementation and convert the analog neuron output to a digital (i.e., a binary value). Correspondingly, each of the local DACs 420 may function to receive reference signals from the global DAC 415 that each of the local DACs 420 may function to source to the internal node 430 of the local ADC 410. Accordingly, based on a neuron output and a reference signal from a local DAC 420, each respective local ADC 410 may function to generate a binary output. In some embodiments, the binary output generated by each respective local ADC 410 may be a biasing input signal to a respective local DAC 420 of each local ADC 420 for incrementing or decrementing a charge on a local capacitor or storage device associated with the local DAC 420.

Accordingly, in typical digital circuitry used for implementing neural network models, the matrix multiplication calculations are performed using digital values (binary values). By comparison, in embodiments of the system 100 implementing a mixed-signal computing architecture, the matrix multiplication calculations are performed in the current (analog) domain thereby allowing for up to fifty times (50×) or greater improvement in power consumption by the system. That is, the system 100 functions to lower power consumption by up to 50× or greater.

Generally, the global reference generator no may be configured with a high-speed analog design with better matching and noise performance. Additionally, or alternatively, the configuration of the global reference generator 110 may include reference signal generation devices and/or circuitry that allows the global reference generator 110 to generate analog reference signals and also, causes the global reference generator 110 to be large relative to each of the plurality of local accumulators 120. Additionally, or alternatively, the global reference generator no may be configured to transmit reference signals sequentially (e.g., one at a time) or simultaneously (e.g., multiple signals per clock cycle). It shall be noted that the global reference generator no may be configured to generate and/or transmit reference signals in any suitable manner contemplated herein or otherwise known in the art.

The shared signal path 125 may be a single (electrically conductive) signal wire, signal trace, or signal path with multiple connections to the plurality of local accumulators 120. The shared signal path preferably functions to allow a transmission of reference signals from the global reference generator no to each of the plurality of local accumulators 120 that are connected thereto or positioned (or arranged) along the shared signal path 125. The shared signal path 125 may be configured such that any reference signal originating from the global reference generator no being transmitted along the shared signal path 125 may be copied or otherwise, mirrored by each of the local accumulators 120 connected to the shared signal path 125.

In one implementation, the shared signal path 125 may be used by the global reference generator no to provide serialized (analog) reference signals. Accordingly, in such implementation, the shared signal path 125 may function to provide single bit reference signals every clock cycle to the local accumulators 120. For instance, if the global reference generator 110 comprises a three-bit DAC or the like, the shared signal path 125 may provide each of the three bits individually and sequentially to each of the plurality of local accumulators 120 and preferably, in three clock cycles. In this way, the shared signal path 125 enables a single signal source (e.g., the global reference generator) to provide accurate reference signals to multiple local accumulators in lieu of a dedicated signal source for each of the local accumulators 120. A technical benefit of such configuration is considerably smaller circuitry for implementing computationally-intensive applications and/or programs (e.g., neural network models, etc.).

The local accumulators 120 may function to generate an analog output to a local output receiver (e.g., local analog-to-digital converter) or the like, such as illustrated in FIG. 3A. In a preferred embodiment, the plurality of local accumulators 120 comprise a plurality of local digital-to-analog converters (LDACs) that may function to generate the analog output over several clock cycles using the global reference signals from the global reference generator 110. It shall be noted that depending on the reference signal generation mode of the global reference generator 110, the plurality of local accumulators 120 may generate the analog output over a single clock cycle. The configuration of the LDACs may generally exclude reference signal generation devices, as the reference signals for each of the LDACs may be provided by the global reference generator 110 and in general, the reference signal generation devices and/or circuitry are large. Resultantly, this configuration enables the LDACs to be considerably smaller in size and area consumed on a printed circuit board or panel of an integrated circuit. In comparison to a global DAC, for instance, the LDACs may be up to ten (10) to twenty (20) or more times smaller in size and area. This allows for great area and power efficiencies on an integrated circuit or computer chip. However, it shall be noted that, in some embodiments, each of the plurality of LDACs may include one or more types of reference signal accumulation/aggregation/summation/reconstruction circuitry that function to output a resultant reference signal, as discussed in more detail below. That is, while in some embodiments, the local accumulators 120 (or LDACs) may function to accumulate reference signals, it is also possible in some variations for the local accumulators to increment/decrement an energy storage device or perform summation functions based on the encoding scheme of the global reference generator 110 and the configuration of each respective local accumulator 120.

As mentioned above, each of the plurality of local accumulators 120 may include an energy storage device 122, current mirrors 124, and in some embodiments, comparator circuitry. The energy storage device 122 preferably functions to store locally at the local accumulator 120 energy values, such as analog energy values including current or voltage values. Preferably the energy storage device 122 comprises a capacitor, however, the energy storage device 122 may be any suitable electrical energy storing element, such as a flash transistor operating in series or the like. In some embodiments, each of the plurality of local accumulators 120 may function to perform arithmetic functions against the energy storage device 122 based on one or more signal inputs (e.g., sequential inputs). Accordingly, a local accumulator 120 may function to add and/or subtract charge on the energy storage device 122 depending on a value of a received reference signal. Each local accumulator 120 may, additionally or alternatively, function to integrate a (voltage) charge on the capacitor based on one or more signal inputs.

The current mirrors 124 of each of the plurality of local accumulators 120 function to duplicate or copy a reference current signal provided through the shared signal path 125. Specifically, in some embodiments, the global reference generator 110 functions to provide a reference current signal via the shared signal path 125. The reference current signal may be received by each of the local accumulators 120 connected to or positioned along the shared signal path 125. Accordingly, using the current mirrors 124 at each respective local accumulator 120, the local accumulator 120 functions to copy the reference current signal (e.g., the global reference signal) for purposes of generating or accumulating an output signal.

In a preferred embodiment, the current mirrors 124 comprise circuits designed to copy a current through one active device by controlling the current in another active device of a circuit while keeping the output current constant irrespective of loading. The current mirrors 124 may function to copy a varying signal current or a constant signal current (depending on whether the global reference generator 110 provides a constant or varying global reference signal) and provide bias currents and/or active loads to circuits. Preferably, the circuits defining the current mirrors 124 include an inverting current amplifier (ideally) that, in most embodiments, functions to reverse a current direction as well or may be a current-controlled current source. However, it shall be noted that the current mirrors may include any suitable circuitry for copying a reference current signal.

Referring to FIG. 1A, one implementation of a local accumulator 120 is illustrated in which the global reference generator 110 functions to generate bias voltages (e.g., global reference signals) for two current mirrors 124 in the local accumulator 120. The bias voltages provided by the global reference generator 110 may be generated such that the currents copied in the current mirrors 124 are weighted. For instance, in a binary-weighted implementation of the global reference generator 110 of system 100, bias voltages generated by the global reference generator no may be updated every clock cycle. In this way, the copied current in the current mirrors 124 changes in a binary fashion. In this implementation, a sequential input or the like may be added in some charge on the energy storage device 122 (capacitor) of the local accumulator 120 or some charged subtracted from the energy storage device 122. The amount of charge that is added to or subtracted from the energy storage device 122 is preferably a function of the copied current in the local accumulator 120—since the copied current changes in a binary fashion, the charge added or subtracted functions to change in a similar or same manner. Accordingly, for an N-bit (e.g., 8-bit) global DAC or the like, N (e.g., N=8) clock cycles would be required to create a required output at the local DAC.

In one variant implementation of the system 100, the local accumulator 120 when implemented as a LDAC functions to increment/decrement a charge on an energy storage device 122 based on thermometer encoded reference signals provided by the global reference generator 110 (thermometer encoding global reference generator). In such variant implementation, an amount of charge incremented or decremented from the energy storage device 122 may be constant in each clock cycle. In such implementation, for an N-bit global reference generator 110, $2^N$ cycles would be required to create a required output at the local accumulator 120 (LDAC).

Additionally, in yet a further implementation, a segmented global reference generator 110 may be implemented in which two or more global reference generators (or two or more DACs) are combined to achieve a single, higher resolution global reference generator 110 to provide a required performance (e.g., more accurate reference signal generation, better matching, higher noise performance, etc.) and generate high resolution analog reference signals (e.g., analog signals having a resolution and/or accuracy satisfying or exceeding a resolution threshold). In use, the different segments of the higher resolution global reference generator may be used to handle various signal generation tasks where the outputs of these different segments may be combined to achieve a unitary output. In one or more embodiments in which a segmented global reference generator may be implemented using a combination of two binary-weighted DACs that includes eight (8) current sources. In such embodiments, each of the two binary-weighted DACs may output half of a required current value to each of the integrators or local accumulators 120, therefore, causing each of the local accumulators to integrate twice. A resultant technical advantage of such configuration, may be an overall reduction in mismatch due to higher accuracy current values produced by each of the binary-weighted DACs of the segmented global reference generator.

Additionally, or alternatively, the system 100 may, in some embodiments, include a plurality of local analog-to-digital converters (ADCs) (not shown) that function to receive outputs from the output circuitry of plurality of local accumulators 120. Specifically, in some embodiments, once a local accumulator 120 has achieved a sufficient (stored) charge value on a capacitor or the like, this charge value may be output or define an analog reference signal to a corresponding local ADC that converts an analog input signal to a binary output by comparing it to the analog reference signal. In such embodiments, each local ADC may include comparator circuitry that may be used to compare the analog input signal to a reference signal for purposes of determining or generating the binary output, as described in U.S. patent application Ser. No. 15/890,402, which is incorporated herein by this reference in its entirety.

Similar to the global DAC-to-local DACs architecture(s) described herein, a global reference signal generator (e.g., a global ADC) to local ADCs architecture may be implemented. In such implementation, a plurality of local ADCs may be provided one or more reference signals from a global ADC via a shared common signal path. Such configuration may similarly achieve several technical benefits including a smaller area of circuitry architecture, energy efficiencies (e.g., lower power consumption), and the like.

Referring to FIG. 1B, another implementation of a local accumulator 120 is illustrated in which the global reference generator 110 functions to generate bias voltages bias voltages (e.g., global reference signals) for an amplifier-based integrator of the local accumulator 120. A technical advantage of such implementation includes enabling the local accumulator 120 with a single current source (rather than two current sources). In a preferred configuration of the local accumulator 120 with an amplifier-based integrator, a dummy path may be implemented that reduces an effect of charge injection, which occurs when (transistor) switches actuate to an ON or OFF state. Such a configuration may be achieved with an additional transistors.

Additionally, or alternatively, a gate of a bias n-channel MOSFET (nmos) or the like may be grounded (rather than being connected to a bias from the global reference generator 110). One or more drains of the switches in this configuration of the local accumulator 120 may be connected in the following manner: a drain of a left (replica) switch may be connected to a drain of a right switch and a drain of a right (replica) switch may be connected to a drain of a left switch.

2. A Method for Mixed Signal Computing

As shown in FIG. 2, the method 200 includes providing a global analog reference signal to be transmitted along a shared signal communication path S210, transmitting the global analog reference signal via the shared signal communication path S215, duplicating the global analog reference signal at each of a plurality of local accumulators S220, and generating at each of the plurality of local accumulators an output signal S230.

The method 200 functions to enable a global reference generator, such as a global DAC, to provide one or more global reference signals along a shared signal communication path. Along the shared signal communication path, the method 100 permits any local accumulators connected thereto, such as local DACs, to copy the one or more analog global reference signals to generate a final output. Thus, in the method 100, for each global DAC there may be multiple local DACs that rely on the global DAC for reference signals for the purpose of generating an output signal at each of the multiple local DACs.

S210, which includes providing a reference signal to be transmitted along a shared signal communication path, functions to use a digital (binary) input signal to generate an analog reference signal to a plurality of local accumulators. In one example, a binary or digital signal input may be received at a global DAC (e.g., global reference generator 110), that the global DAC translates into a global analog reference signal that may be propagated to each of a plurality of local DACs (e.g., local accumulators 120) via a shared signal communication path. The number of clock cycles over which the global analog reference signal is transmitted to each of the plurality of local DACs may depend on a configuration (e.g., bit configuration and/or signal encoding scheme) of the global DAC.

In a first implementation, when the global DAC comprises a binary-weighted analog reference signal generator, the global DAC may be configured to generate one reference signal that is transmitted over N clock cycles (e.g., binary summation over time). In such implementation, it may take up to N clock cycles (where N matches the N-bit of the global DAC) to transmit an analog reference signal sufficient to generate an output signal at each of the local DACs. Additionally, or alternatively, a log(N)-bit global DAC may be employed when or if output signal levels are binary weighted. By way of an example, an 8-bit DAC may function to generate signal levels between 0-255, but for the purposes of the global DAC, only signal levels 0, 1, 2, 4, 8, 16, 32, 64, and 128 may be required. Thus, significantly reducing the signal output levels. That is only 8 output signal levels, even if the output signal levels are binary spaced (i.e., binary weighted output).

In a second implementation, when the global DAC comprises a non-binary-weighted analog reference signal generator, it may take up to $2^N$ cycles (N matches the N-bit of the global DAC) to transmit an analog reference signal sufficient to generate an output signal at each of the local DACs.

In a third implementation, the global DAC may be configured to generate an N-reference signal that is transmitted over a single cycle. In this way, the output conversion time at the local DAC is significantly reduced and the local DAC may be limited to performing addition functionality to an energy storage device, such as a capacitor.

In a fourth implementation, the global DAC may be configured to generate an M-reference signal over ceil (N/M) cycles. In this way, analog reference signals generated by the global DAC may be transmitted in pairs to each of the local DACs.

Additionally, various encodings schemes may be implemented via the method 100 for achieving a final output signal at the local DACs. For example, one or more of thermometer encoding, binary encoding, segmented encoding, logarithmic encoding, and the like may be implemented. In some embodiments, one or more of the various encoding schemes may be implemented in combination in which various and/or a combination of global DACs function to generate reference signals according to one or more encoding types selected among various encoding schemes. In one example, in a system having at least two global DACs, where each of the at least two global DACs functions to provide reference signals to a plurality of local DACs associated therewith, a first of the two global DACs may be designed to generate reference signals in accordance with thermometer encoding and a second of the at least two global DACs may be designed to generate reference signals using binary-weighted encoding. It shall be noted that the global DACs described herein may be capable of employing any known, combination, or reasonable encoding scheme.

Additionally, or alternatively, S210 may function to provide and/or transmit the signals in any suitable manner including: using the global DAC to provide multiple analog reference signals that remain constant or fixed; providing a single analog reference signal that varies or changes or over time (e.g., binary summation); providing multiple analog signals that vary over time, and the like.

In one implementation, S210 may function to implement a global reference generator having a pulse modulator or the like that enables a variation of a pulse width and/or a number of pulses generated per clock cycle. Accordingly, in one or more embodiments, S210 may function to increase and/or decrease a pulse width during a clock cycle that enables a local accumulator, such as a local DAC, to correspondingly, vary (increase or decrease) a charge (voltage) stored on an energy storage device (such as a capacitor). Additionally, or alternatively, S210 may function to increase and/or decrease a number of pulses during a clock cycle that enables a local accumulator, such as a local DAC, to correspondingly, vary (increase or decrease) a charge (voltage) stored on an energy storage device (such as a capacitor).

Additionally, S215 may function to provide the reference signal over a shared or common signal communication path. In a preferred embodiment, the shared signal communication path originating at a global DAC may extend to each of a plurality of local DACs thereby placing the global DAC in operable signal communication with each of the plurality of local DACs. In this way, each reference signal generated by the global DAC may be passed along to each of the plurality of local DACs along the shared signal path.

S220, which functions to duplicate the global analog reference signal, functions to copy the global analog reference signal transmitted along the shared signal communication path. Specifically, each of the local DACs may include current mirrors that when implemented by the local DAC function to copy a global analog reference signal or charge (either voltage or current) provided by the global DAC.

Depending on encoding scheme or signal transmission method implemented at the global DAC, S220 functions to accumulate the global analog reference signal (or a resulting electrical charge) onto an energy storage device (e.g., a capacitor) at each of the local DACs that is in signal communication with the global DAC along the shared signal communication path. Specifically, S220 functions to add or subtract charge from capacitors of the local accumulators. S220 may function to accumulate or generate a charge in any suitable manner including using charge pump circuitry, using pulsed current sources, using an integrating amplifier (e.g., an integrator).

In some embodiments, a manner in which each of the plurality of local DACs accumulates and/or integrates a charge on an energy storage device over a predetermined number of clock cycles is based on a receipt of one or more bias input signals at each of the plurality of local DACs. Accordingly, S220 may additionally function to receive at each of the plurality of local DACs one or more bias input signals from a bias input source (e.g., a global bias input source or generator, etc.) that indicates to a local DAC whether an electrical charge should be incremented to or decremented from a charge on an energy storage device (e.g., a capacitor or the like).

S230, which includes generating an output charge, functions to output a sum or an accumulation of a charge based on one or more global analog reference signals from the global reference generator. In the case that the energy storage device of the local DAC (e.g., local accumulator) comprises a capacitor, S230 may function to output the resultant charge of the capacitor in various manners.

In one implementation, S230 may function to connect the capacitor to an output destination (terminal) and output the summed or accumulated charge (current or voltage) of the capacitor directly to the output destination.

In a second implementation, S230 may function to connect the capacitor to an input terminal of a current source, such as a (flash) transistor, and output the charge on the capacitor to the input of the current source. Additionally, or alternatively, in a third implementation, S230 may function to connect the capacitor to an input of a tunable resistor and output the charge of the capacitor to the input of the tunable resistor.

Additionally, or alternatively, in a further implementation, the analog signal references from the global DACs may be used to performed a pulsed write of a non-volatile memory device, such as a resistive random access memory (RRAM). In such implementation, the output generated in S230 may include a current signal or an impedance.

It shall be understood that the method 200 is an exemplary method that may be implemented in any suitable order to achieve the inventions and/or embodiments of the inventions within the purview or that may be easily contemplated in view of the disclosure provided herein. Thus, the order and process steps should not be limited to the exemplary order provided herein.

The methods of the preferred embodiment and variations thereof can be embodied and/or implemented at least in part as a machine configured to receive a computer-readable medium storing computer-readable instructions. The instructions are preferably executed by computer-executable components preferably integrated with the lithography system and one or more portions of the processors and/or the controllers implemented thereby. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various methods, apparatus, and systems described herein.

As a person skilled in the art will recognize from the previous detailed description and from the figures and claims, modifications and changes can be made to the preferred embodiments of the invention without departing from the scope of this invention defined in the following claims.

What is claimed is:

1. A mixed-signal integrated circuit comprising:
    a reference signal source configured to generate a plurality of current reference signals based on an input of digital data;
    a shared signal path that is in electrical connection with an output terminal of the reference signal source, wherein the reference signal source is configured to output, via the output terminal, the analog reference signals to the shared signal path;
    a plurality of current sources arranged in electrical connection along the shared signal path, wherein each of the plurality of current sources is configured to copy one or more of the plurality of current reference signals; and
    a control signal source configured to generate a control signal that informs a current copying operation of each of the plurality of current sources.

2. The mixed-signal integrated circuit according to claim 1, wherein:
each of the plurality of current sources comprises a current mirror, and
each of the plurality of current sources is configured to implement the current mirror to copy the one or more the plurality of current reference signals.

3. The mixed-signal integrated circuit according to claim 1, wherein
each of the plurality of current sources comprises a pair of current mirrors, and
each of the plurality of current sources is configured to implement the pair of current mirrors to copy the one or more of the plurality of current references signals based on the control signal.

4. The mix-signal integrated circuit according to claim 3, wherein
the control signal comprises a differential signaling input that controls the current copying operation of each of the plurality of current sources.

5. The mixed-signal integrated circuit according to claim 3, wherein
each of the plurality of current sources comprises a pair of current mirrors, and
each of the plurality of current sources is configured to implement the pair of current mirrors to generate either an additive current or a subtractive current based on the control signal.

6. The mixed-signal integrated circuit according to claim 1, wherein
an output terminal of each of the plurality of current sources is electrically connected to one input terminal of a plurality of input terminals of a neural network implementation, and
one or more of the plurality of current sources is configured to output to a distinct one input terminal of the plurality of input terminals of the neural network implementation.

7. The mixed-signal integrated circuit according to claim 6, wherein:
each of a plurality of output terminals of the neural network implementation is electrically connected to an input terminal of each of a plurality of analog-to-digital converters (ADCs), and
each of the plurality of output terminals of the neural network implementation sources a sum of currents output from the plurality of current sources to a distinct one of the plurality of ADCs.

8. The mixed-signal integrated circuit according to claim 7, wherein each of the plurality of ADCs outputs a distinct control signal to a respective one of the plurality of current sources.

9. The mixed-signal integrated circuit according to claim 1, wherein:
the reference signal source comprises an N-bit digital-to-analog converter configured to output N current reference signals to the shared signal path, and
N is greater than one (1).

10. The mixed-signal integrated circuit according to claim 1, wherein:
the reference signal source comprises a binary-weighted digital-to-analog converter configured to generate binary-weighted current signals based on the input of digital data, and
the plurality of current reference signals comprises a plurality of binary-weighted current signals that vary in value.

11. The mixed-signal integrated circuit according to claim 1, wherein
the shared signal path comprises a single electrically conductive signal wire having multiple connections that connect each of the plurality of current sources at distinct positions along the shared signal path.

12. The mixed-signal integrated circuit according to claim 1, wherein:
the shared signal path comprises a single electrically conductive signal wire having multiple connection terminals that connect an input terminal of each of the plurality of current sources at distinct positions along the shared signal path, and
each of the plurality of current sources being serially arranged along the shared signal path downstream of the reference signal source.

13. An integrated circuit comprising:
a reference signal source configured to generate analog reference signals based on an input of digital data;
a shared signal path that is in electrical connection with an output terminal of the reference signal source, wherein the reference signal source is configured to output, via the output terminal, the analog reference signals to the shared signal path;
a plurality of current sources electrically arranged along the shared signal path, wherein each of the plurality of current sources is configured to generate current based on the analog reference signals of the shared signal path; and
a bias signal source configured to generate a bias signal input that informs a current generation of each of the plurality of current sources.

14. The integrated circuit according to claim 13, wherein:
each of the plurality of current sources comprises a current mirror, and
each of the plurality of current sources is configured to implement the current mirror to copy the one or more the plurality of current reference signals.

15. The integrated circuit according to claim 13, wherein
each of the plurality of current sources comprises a pair of current mirrors, and
each of the plurality of current sources is configured to implement the pair of current mirrors to copy the one or more of the plurality of current references signals based on the bias signal input.

16. The mix-signal integrated circuit according to claim 3, wherein
the control signal comprises a differential signaling input that controls the current copying operation of each of the plurality of current sources.

17. The mixed-signal integrated circuit according to claim 3, wherein
each of the plurality of current sources comprises a pair of current mirrors, and
each of the plurality of current sources is configured to implement the pair of current mirrors to generate either an additive current or a subtractive current based on the control signal.

18. A method of implementing a mixed-signal computing circuit, the method comprising:
sourcing, by a reference signal source, a plurality of analog reference signals along a shared signal communication path to a plurality of current sources, wherein:
each of the plurality of current sources is serially arranged in electrical connection with the shared signal communication path, and each of the plurality of current sources is configured to copy one or more of the plurality of analog reference signals; and implementing a control signal source configured to generate a control signal that informs a current copying operation of each of the plurality of current sources.

19. The integrated circuit according to claim 18, wherein:

each of the plurality of current sources comprises a current mirror, and each of the plurality of current sources is configured to implement the current mirror to copy the one or more the plurality of analog reference signals.

20. The integrated circuit according to claim 18, wherein each of the plurality of current sources comprises a pair of current mirrors, and each of the plurality of current sources is configured to implement the pair of current mirrors to copy the one or more of the plurality of analog references signals based on the control signal.

* * * * *